United States Patent
Bodano et al.

(10) Patent No.: US 7,342,440 B2
(45) Date of Patent: Mar. 11, 2008

(54) CURRENT REGULATOR HAVING A TRANSISTOR AND A MEASURING RESISTOR

(75) Inventors: Emanuele Bodano, Padua (IT); Michael Lenz, Zorneding (DE)

(73) Assignee: Infineon Technologies Austria AG, Villach (AT)

( * ) Notice: Subject to any disclaimer, the term of this patent is extended or adjusted under 35 U.S.C. 154(b) by 148 days.

(21) Appl. No.: 11/367,773

(22) Filed: Mar. 3, 2006

(65) Prior Publication Data
US 2006/0203400 A1 Sep. 14, 2006

(30) Foreign Application Priority Data
Mar. 4, 2005 (DE) .................. 10 2005 010 103.9

(51) Int. Cl.
*G01F 1/56* (2006.01)
*G01F 1/575* (2006.01)
*H01L 25/00* (2006.01)
*H01L 27/00* (2006.01)

(52) U.S. Cl. ............... 327/564; 327/565; 327/566; 323/265; 323/273; 257/536

(58) Field of Classification Search ........... 323/265, 323/273; 327/564–566; 257/536
See application file for complete search history.

(56) References Cited

U.S. PATENT DOCUMENTS

| 5,764,041 A | 6/1998 | Pulvirenti et al. |
| 6,400,163 B1 | 6/2002 | Melcher et al. |
| 6,496,345 B1 | 12/2002 | Smith |
| 2004/0178778 A1 | 9/2004 | Bansal |

FOREIGN PATENT DOCUMENTS

| EP | 0 994 401 A2 | 4/2000 |
| WO | WO 2004/045038 A1 | 5/2004 |

*Primary Examiner*—Evan Pert
(74) *Attorney, Agent, or Firm*—Maginot, Moore & Beck (57) ABSTRACT

The invention relates to a current regulator having the following features:
a first semiconductor body (1; 1') having a first and second terminal contact (11, 12),
a transistor (T) having a control terminal and a load path, which is integrated in the semiconductor body (1; 1') and the load path of which runs between the terminal contacts (11, 12) of the semiconductor body,
a current measuring resistor (22), which is at least partly formed by a section of the load path of the transistor,
an evaluation and drive circuit (3), which is connected to the current measuring resistor (22) and which is designed to drive the transistor depending on a voltage across the measuring resistor (22).

20 Claims, 8 Drawing Sheets

CURRENT REGULATOR HAVING A TRANSISTOR AND A MEASURING RESISTOR

The present invention relates to a current regulator.

A current regulator can be realized for example using a transistor connected in series with a measuring resistor. In this case, the transistor is driven by a drive circuit depending on a comparison of the voltage present across the measuring resistor with a reference voltage, with the aim of adjusting the voltage across the measuring resistor to the value of the reference voltage. The current through a load connected in series with the measuring resistor is then proportional to the quotient of the reference voltage and the resistance of the nonreactive resistor.

The current measuring resistor makes it more difficult for such a current regulator to be integrated in a single integrated circuit, since nonreactive resistors can be realized in integrated circuits only with a considerable outlay in respect of space. The use of a discrete component as resistance element adversely affects the costs in the realization of such a current regulator.

Besides current regulators, current mirror arrangements are also used for supplying loads with a constant current. Such arrangements have a constant-current source, the current of which is "mirrored" into the load current path of a load by means of one or more current mirrors.

It is an aim of the present invention to provide a current regulator which can be realized simply and cost-effectively.

This aim is achieved by means of a current regulator having the features of claim 1. The subclaims relate to advantageous refinements of the invention.

The current regulator comprises a first semiconductor body having a first and second terminal contact, and also a transistor having a control terminal and a load path, said transistor being integrated in the semiconductor body. In this case, the load path runs between the terminal contacts of the semiconductor body. The current regulator additionally comprises a current measuring resistor, which is at least partly formed by a section of the load path of the vertical transistor, and also a drive circuit, which is connected to the current measuring resistor and which is designed to drive the transistor depending on a voltage across the current measuring resistor.

The transistor may be a vertical transistor or a lateral transistor. In connection with the present invention, a vertical transistor is to be understood as an arbitrary transistor which has at least three transistor zones arranged alongside one another in a vertical direction of the semiconductor body, that is to say the load path of which runs in the vertical direction of the semiconductor body. A lateral transistor is a transistor in which the three transistor zones are arranged alongside one another in a lateral direction of the semiconductor body. The load path of a lateral transistor thus runs in the lateral direction of the semiconductor body.

In the case of a bipolar transistor, the transistor zones are the emitter zone, the base zone and the collector zone of the transistor. In the case of a field effect transistor, said transistor zones are its source zone, its body zone and its drain zone, in which case, if appropriate, a drift zone of the same conduction type as the drain zone and doped more weakly compared with the drain zone may be arranged between the body zone and the drain zone. In the case of an IGBT, four transistor zones are present, namely an emitter zone, first and second base zones and a collector zone.

One embodiment of the invention provides for the first transistor zone to be connected to the first terminal contact, the third transistor zone to be connected to the second terminal contact, and for the current measuring resistor to be at least partly formed by the third transistor zone.

Consequently, in the case of the current regulator according to the invention, sections that fulfill two functions are present in the semiconductor body. Said sections of the semiconductor body firstly form a part of the load path of the transistor, and said sections of the semiconductor body secondly form the current measuring resistor. The current measuring resistor can thereby be realized in a particularly space-saving manner.

Two terminal contacts are required in order to be able to tap off a measurement voltage at said current measuring resistor. In this case, one of the terminal contacts may be formed by that one of the first and second terminal contacts which adjoins the transistor zone which at least partly forms the current measuring resistor. In order to be able to tap off a voltage across the current measuring resistor, it is thus merely necessary to produce an additional terminal contact. Provided that the position of this further terminal contact on the semiconductor body is chosen such that the terminal contact is spaced apart from that transistor zone which forms part of the current measuring resistor, a highly doped connection zone which connects the terminal contact to the respective transistor zone with low resistance is advantageously provided.

The evaluation and drive circuit is preferably designed to compare, during the operation of the current regulator, a voltage present across the current measuring resistor with a reference voltage and to drive the vertical transistor depending on this comparison result.

The evaluation and drive circuit is preferably integrated in the same semiconductor body as the transistor. However, there is also the possibility, furthermore, of integrating the vertical transistor in a first semiconductor body and the evaluation and drive circuit in a second semiconductor body, and in this case of arranging the second semiconductor body on the first semiconductor body or alongside the first semiconductor body.

In all three variants, there is the possibility of accommodating the transistor with the current measuring resistor and the evaluation and drive circuit in a single chip housing which merely has to have two connections or connection legs.

The present invention is explained in more detail below on the basis of exemplary embodiments.

FIG. 3 shows cross sections (FIGS. 3a and 3b) through and a plan view (FIG. 3c) of a chip arrangement for the current regulator according to the invention in order to illustrate the construction at the "packaging level".

In the figures, unless specified otherwise, identical reference symbols designate identical component regions, circuit components and signals with the same meaning.

Figure 1:
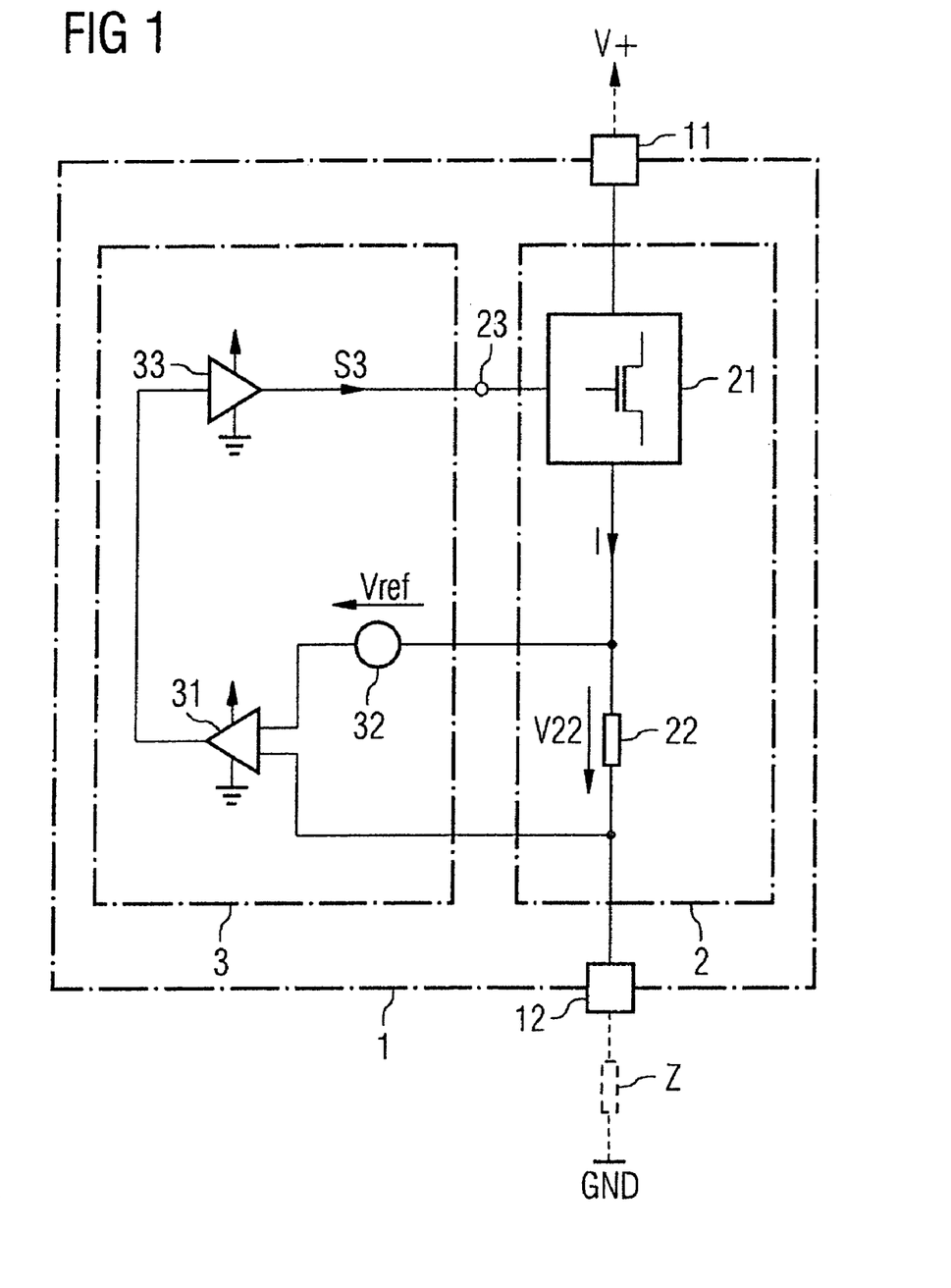
FIG. 1 shows a basic circuit diagram of the current regulator according to the invention, said current regulator having a transistor, a current measuring resistor, which is at least partly formed by the load path of the transistor, and also an evaluation and drive circuit.

Referring to FIG. 1, the current regulator according to the invention comprises a transistor 2, which is merely illustrated schematically as a circuit block in FIG. 1, having a control terminal 23 and having a load path running between terminal contacts 11, 12 of a semiconductor body 1 in which the transistor 2 is integrated. Said semiconductor body is merely illustrated schematically as a dash-dotted line in FIG. 1. A current measuring resistor 22 is likewise connected between the terminal contacts 11, 12. Said current measuring resistor 22, in a manner yet to be explained, is part of the load path of the transistor 2. In order to illustrate this double function of the vertical transistor 2, the electrical equivalent circuit diagram in FIG. 1 illustrates a transistor element 21 and a resistance element 22 connected in series with the transistor element 21.

The control terminal 23 of the transistor 2 is driven by an evaluation and drive circuit 3. Said evaluation and drive circuit is designed to compare a voltage V22 present at the measuring resistor 22 during operation of the current regulator with a reference voltage Vref and to drive the control terminal 23 of the transistor 2 depending on the comparison result. In the example, the evaluation and drive circuit comprises a reference voltage source 32 for providing the reference voltage Vref and also a differential amplifier 31, to which the difference between the measurement voltage V22 and the reference voltage Vref is fed as input signal. An output signal of the differential amplifier 31 is fed via an optional driver circuit 33 to the control input of the transistor 23.

In order to illustrate the functioning of the current regulator, one possible purpose for use of this current regulator is outlined in FIG. 1. In this case, the current regulator is connected via the first and second connection terminals 11, 12 in series with a load Z between terminals for supply potential V+ and reference potential GND. During operation, a load current I flows through the transistor 2 and brings about a voltage drop V22 at the current measuring resistor 22. In this case, the evaluation and drive circuit 3 drives the transistor 2 in such a way that said measurement voltage V22 is adjusted to the value of the reference voltage Vref or a value dependent thereon in order thereby to regulate the current I to a predetermined value independently of the supply voltage V+.

The current regulator illustrated is suitable in particular for the supply of light emitting diodes (LEDs), which, as is known, acquire an at least approximately constant current supply.

Figure 2:
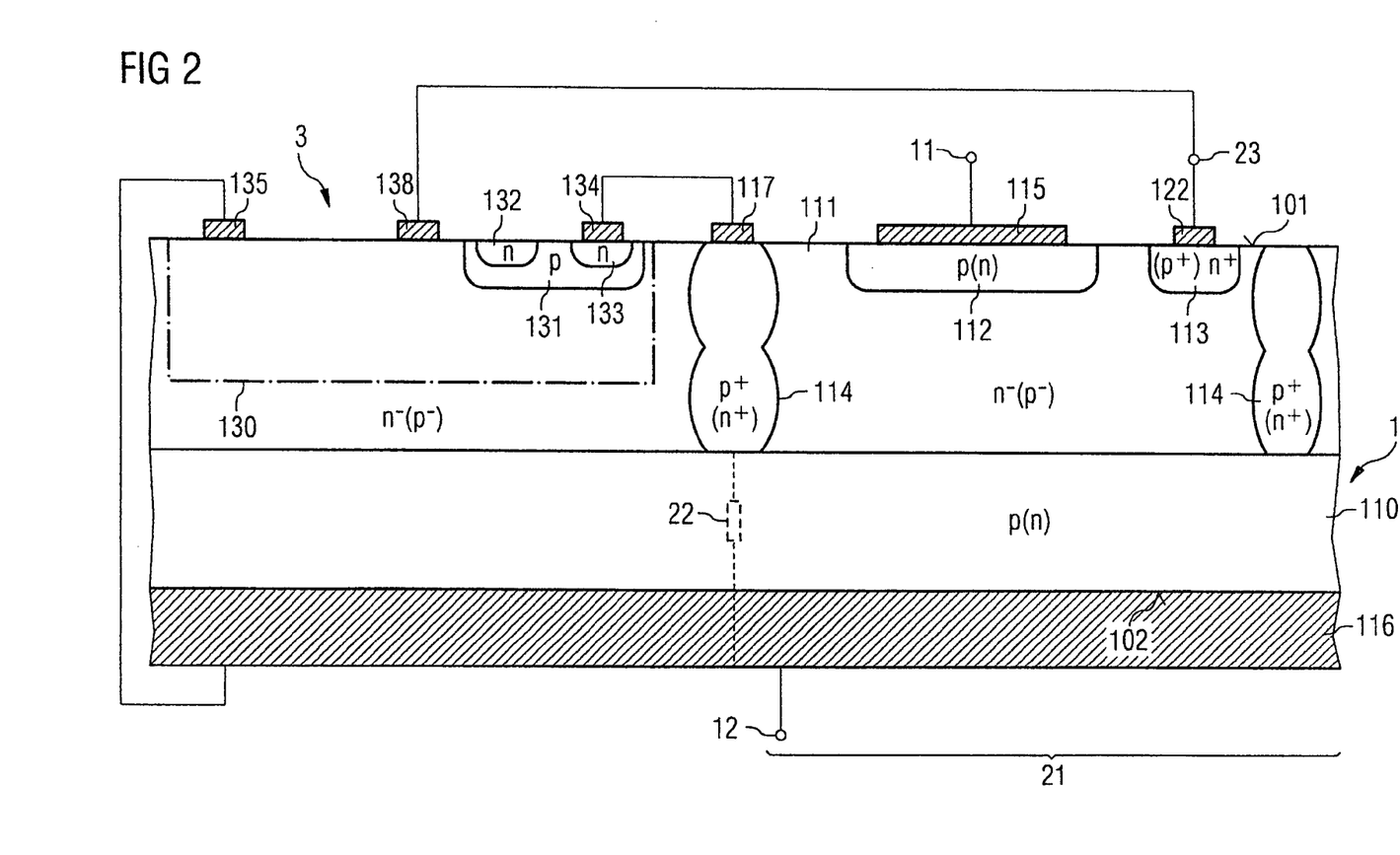
FIG. 2 schematically shows a semiconductor body with a vertical transistor integrated therein, a current measuring resistor integrated therein and an evaluation and drive circuit in cross section.

FIG. 2 shows, on the basis of a cross section through a semiconductor body 1, one possible exemplary realization of a transistor and a current measuring resistor formed by a part of the load path of said transistor. In the example, the transistor is formed as a vertical transistor. The semiconductor body 1 has a first side 101, which is referred to hereinafter as the front side, and a second side 102, which is referred to hereinafter as the rear side. In the example, the transistor is formed as a vertical bipolar transistor having an emitter zone 112, a base zone 111 and a collector zone 110. The emitter, base and collector zones 112, 111, 110 form first, second and third transistor zones, which are arranged adjacent to one another in the vertical direction of the semiconductor body 1. Two transistor zones arranged adjacent in each case are doped complementarily with respect to one another here. The doping types specified without parentheses in FIG. 2 correspond to the doping types for the realization of a pnp bipolar transistor, the emitter and collector zones 112, 110 of which are p-doped and the base of which is n-doped. The doping concentrations for the realization of an npn bipolar transistor are specified in parentheses here in FIG. 2.

The emitter zone 112 is contact-connected by a first connection electrode 115 applied to the front side 101, said first connection electrode forming the first terminal contact 11 of the current regulator. In the example, the rear side is covered over the whole area by a second connection electrode 116, which forms the second terminal contact 12 of the current regulator. Said connection electrode 116 may be formed in particular as an electrically conductive carrier for receiving the semiconductor body 1, which will be explained below with reference to FIGS. 3 to 5. Such a carrier is, in particular, a so-called leadframe.

A further connection electrode 122, which forms the control terminal 23 of the vertical transistor, is provided in the region of the front side 101 of the semiconductor body. Said connection electrode 122 makes contact with a base connection zone 113 arranged in the base zone. Said connection zone 113 is of the same conduction type as the base zone 111, but doped more highly.

In the production of a component arrangement according to FIG. 2, by way of example a semiconductor substrate is provided which forms the later collector zone 110. A semiconductor layer doped complementarily with respect to said semiconductor substrate 110 is applied to the semiconductor substrate, for example by means of an epitaxy method, and forms the later base zone 11 in the region of the vertical transistor. The emitter zone 112 is produced by means of sufficiently known doping methods using suitable masks after the conclusion of the epitaxy method.

The evaluation and drive circuit 3 is also integrated in the semiconductor body 1 alongside the vertical transistor. FIG. 2 merely schematically shows a region 130 in which said evaluation and drive circuit is integrated. In a manner representative of the components of said evaluation and drive circuit, FIG. 2 merely shows a lateral bipolar transistor having a base zone 131, an emitter zone 134 and a collector zone 132.

In this case, the evaluation and drive circuit 3 is integrated in the semiconductor layer which, in the region of the vertical transistor, forms the base zone 111 thereof and which is weakly n-doped or weakly p-doped in the example. The integration of active components, such as transistors for example, in such weakly doped semiconductor layers using mask and doping steps is sufficiently known, so that further explanations in this respect can be dispensed with. Passive components, such as resistors for example, may be formed by weakly doped semiconductor zones or by corresponding resistance materials on the front side 101 of the semiconductor body.

The evaluation and drive circuit 3 has three terminal contacts, a first and a second measurement contact 134, 135 and a drive contact 138. The measurement contacts serve for detecting the measurement voltage present across the current measuring resistor 22 and the drive contact 136 serves for driving the control terminal 23 of the vertical transistor.

The semiconductor region 130 in which the evaluation and drive circuit is integrated is insulated from the vertical transistor by means of pn junctions. For this purpose, a heavily doped semiconductor zone 114 is provided, which is doped complementarily with respect to the base zone 111 and which extends from the front side 101 as far as the collector zone 110 of the vertical transistor. Said heavily doped semiconductor zone 114 annularly encloses the base zone 11 of the vertical transistor in a plane perpendicular to the plane illustrated in FIG. 2. It should be pointed out in this connection that the vertical transistor may be constructed in a cellular manner, in particular, and may have a multiplicity of the structures illustrated in FIG. 2 with an emitter zone 112, a base zone 111 and an "insulation zone" 114 annularly surrounding the base zone. The transistor cells formed in this way may have a common collector zone 110. In this case, the emitter connections of said individual transistor cells are short-circuited, in the same way as the base connections of the individual transistor cells.

Upon realizing that semiconductor layer which partly forms the base zone 111 by means of an epitaxy method, the "insulation zone" may already be produced during said epitaxy method.

In the case of the component in accordance with figure 2, the current measuring resistor 22 is formed by the collector zone 110 of the vertical transistor. In this case, the second connection electrode 116 fulfills the function of a first terminal contact of this current measuring transistor 22. A second terminal contact 117 of this current measuring transistor is formed in the region of the front side 101 of the semiconductor body. Since said second terminal contact 117 is arranged at a distance in the vertical direction from the collector zone 110 forming the current measuring resistor, a low-resistance connection zone is provided between the collector zone 110 and the terminal contact 117. Said low-resistance connection zone is formed by the "insulation zone" 114 in the example. The second terminal contact 117 of the measuring resistor 22 is connected to said zone 114 in the region of the front side.

In a manner that is not specifically illustrated, it would also be possible for the collector zone 110 forming the current measuring resistor to be contact-connected by a highly doped connection zone provided in addition to the insulation zone 114. It should be pointed out in this connection that, of course, the low-resistance connection zone 114 and the terminal contacts 116, 117 also contribute to the total resistance of the current measuring resistor 22. Assuming that a measurement current flowing into the evaluation and drive circuit 3 via the current measuring resistor 22 is very small, in particular the resistance of the connection zone 114 may be disregarded relative to the resistance of the collector zone 110.

Figure 3A:
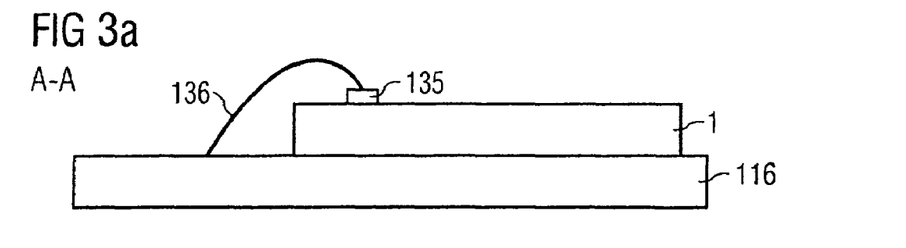
Figure 3B:
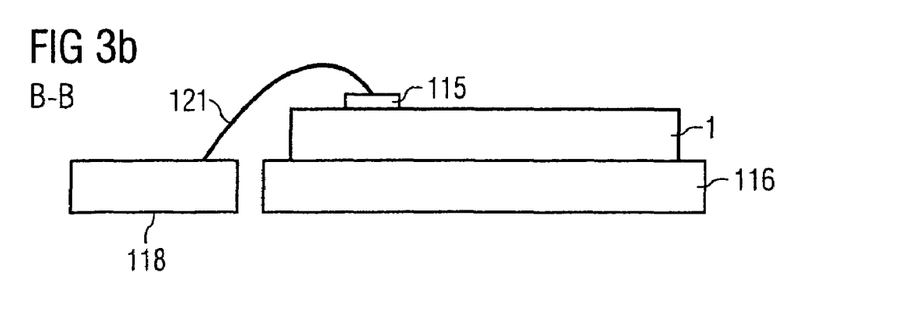
Figure 3C:
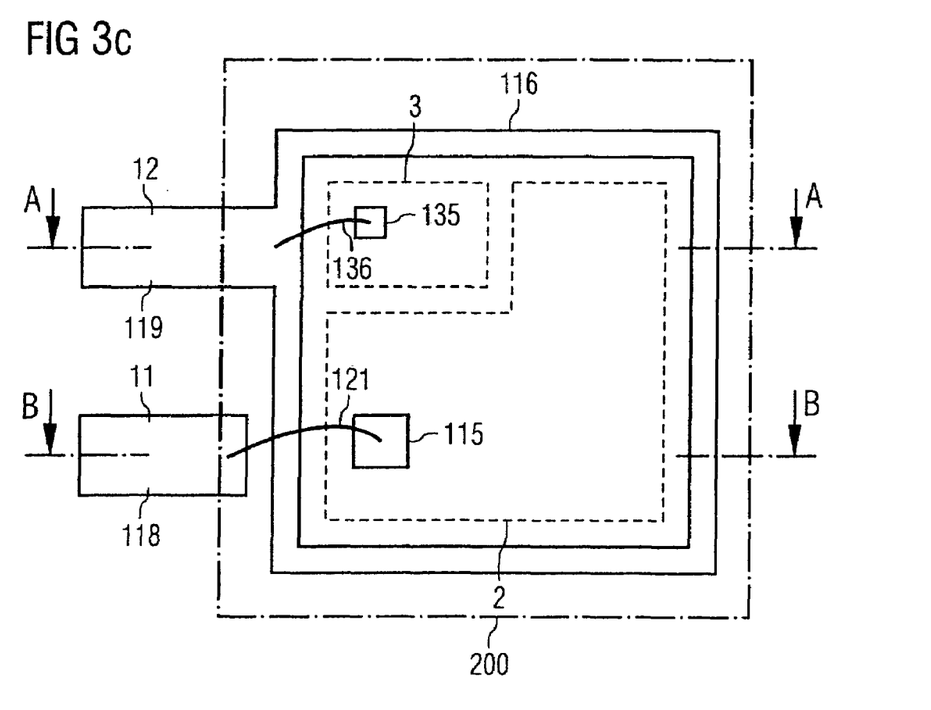

FIG. 3 shows in two sectional planes A-A and B-B (FIGS. 3a and 3b) and in plan view (3c) a possible chip arrangement for the current regulator according to the invention. In this case, the second terminal contact 116 is formed as an electrically conductive carrier element, for example as a leadframe, to which the semiconductor body 1 with the vertical transistor integrated therein and the evaluation and drive circuit integrated therein is applied by its rear side 102. An electrically conductive connecting layer in the semiconductor body 1 and the leadframe 116, for example a solder layer or a layer of an electrically conductive adhesive, is not explicitly illustrated in the figure. The arrangement comprising the semiconductor body 1 and the leadframe 116 is surrounded by a housing 200, which is illustrated in dash-dotted fashion in FIG. 3c. Two connection legs 118, 119 project from said housing, which connection legs form the external connections 11, 12 of the current regulator. In this case, one of the two connection legs 119 is integrally connected to the leadframe 116 to which the semiconductor body 1 is applied. One 136 of the two measurement contacts 135, 136 of the evaluation and drive circuit 3 for tapping off the voltage present across the measuring resistor (22 in FIG. 2) is connected to the leadframe 116 and the connection 119 by means of a bonding wire 136.

The further connection leg 118 of the chip arrangement in accordance with FIG. 3 is separated from the leadframe 116 and connected to the connection electrode 115 by means of a bonding wire 121, which connection electrode makes contact with one of the transistor zones, the emitter zone 112 in the example in accordance with FIG. 2. The connection leg 118 that is not connected to the leadframe forms the first terminal contact 11 of the current regulator.

FIG. 3c illustrates by the dashed lines the regions of the semiconductor body 1 in which the vertical transistor 2 with the current measuring resistor and the evaluation and drive circuit 3 are respectively integrated. FIG. 3c does not illustrate the electrically conductive connection—shown schematically in FIG. 2—between the evaluation and drive circuit 3 and the terminal contact 117 of the current measuring resistor 22 that is arranged in the region of the front side 101 of the semiconductor body. Said electrically conductive connection may be effected in a wiring plane that is arranged above the front side 101 of the semiconductor body and is not specifically illustrated in FIG. 3. On account of the common integration of the vertical transistor and of the current measuring resistor and also of the evaluation and drive circuit 3 in a common semiconductor body, no bonding wire connection is required—in contrast to the situation for the connection of the terminal contacts 115, 135 to the connection legs 118, 119.

Figure 4:
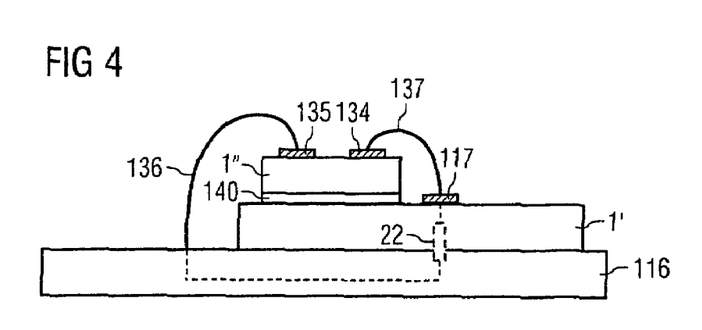
FIG. 4 shows in side view in cross section a further chip arrangement for a current regulator according to the invention, the transistor being integrated in a first semiconductor body and the evaluation and drive circuit being integrated in a second semiconductor body applied to the first semiconductor body.

FIG. 4 shows in side view in cross section a further chip arrangement for a current regulator according to the invention. In this case, the vertical transistor is integrated in a first semiconductor body 1', which is applied to the leadframe 116 by its rear side 102'. The evaluation and drive circuit 3 is integrated in a second semiconductor chip 1", which is applied to the first semiconductor chip 1' using chip-on-chip technology. Said second semiconductor chip 1" has two terminal contacts 134, 135 for connection to the current measuring transistor 22. In this case, a first terminal contact 135 is electrically conductively connected to the leadframe 116 by means of a bonding wire 136. A second terminal contact 134 is connected to a terminal contact 137 on a front side 101' of the first semiconductor body 1' by means of a further bonding wire 137. Referring to FIG. 2, said terminal contact 117 makes contact with the current measuring transistor, which is at least partly formed by a transistor zone of the vertical transistor, for example via a highly doped connection zone (not illustrated in FIG. 4) running in the vertical direction of the semiconductor body 1'.

Apart from the bonding wire connections 136, 137, the second semiconductor chip 1" is for the rest arranged in a manner insulated from the first semiconductor body 1'. An insulation layer 140 is provided for this purpose, said insulation layer being arranged between the two semiconductor bodies 1', 1".

A housing surrounding the chip arrangement is not illustrated in FIG. 4 for reasons of clarity.

Figure 5:
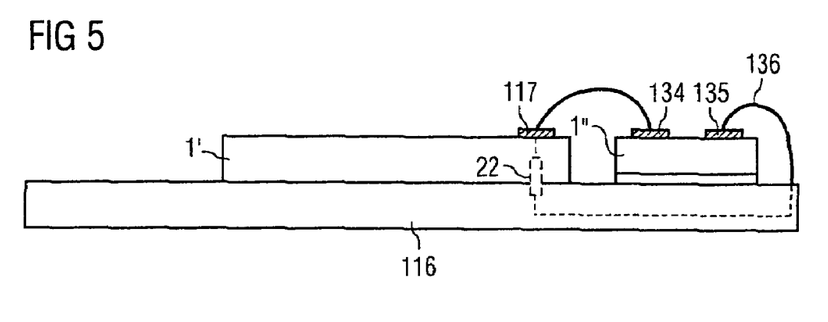
FIG. 5 shows in side view in cross section a further chip arrangement for the current regulator according to the invention, in which chip arrangement the transistor and the evaluation and drive circuit are integrated in semiconductor bodies arranged alongside one another.

FIG. 5 shows a further exemplary embodiment of a chip arrangement of a current regulator according to the invention, in which the vertical transistor is arranged in a first semiconductor body 1' and the evaluation and drive circuit is arranged in a second semiconductor body 1". In this embodiment, using chip-by-chip technology, the two semiconductor bodies 1', 1" are arranged alongside one another on the leadframe 116. In this case, the second semiconductor chip 1" is arranged on the leadframe 116 in an electrically insulating manner by means of an insulation layer.

Connections between these two semiconductor bodies 1', 1" correspond to the connections already explained with reference to FIG. 4. Thus, one of the terminal contacts 135 of the second semiconductor body 1" is connected to the leadframe 116 by means of a bonding wire 136. A second terminal contact 134 is connected to a terminal contact 117 for the current measuring transistor by means of a further bonding wire 137.

FIGS. 4 and 5 show the chip arrangement in a sectional plane corresponding to the sectional plane A-A in accordance with FIG. 3c. The further connection leg (118 in FIG. 3c) of the chip arrangement and also the further connection electrode (115 in FIG. 3c) are therefore not illustrated in FIGS. 4 and 5.

Figure 6:
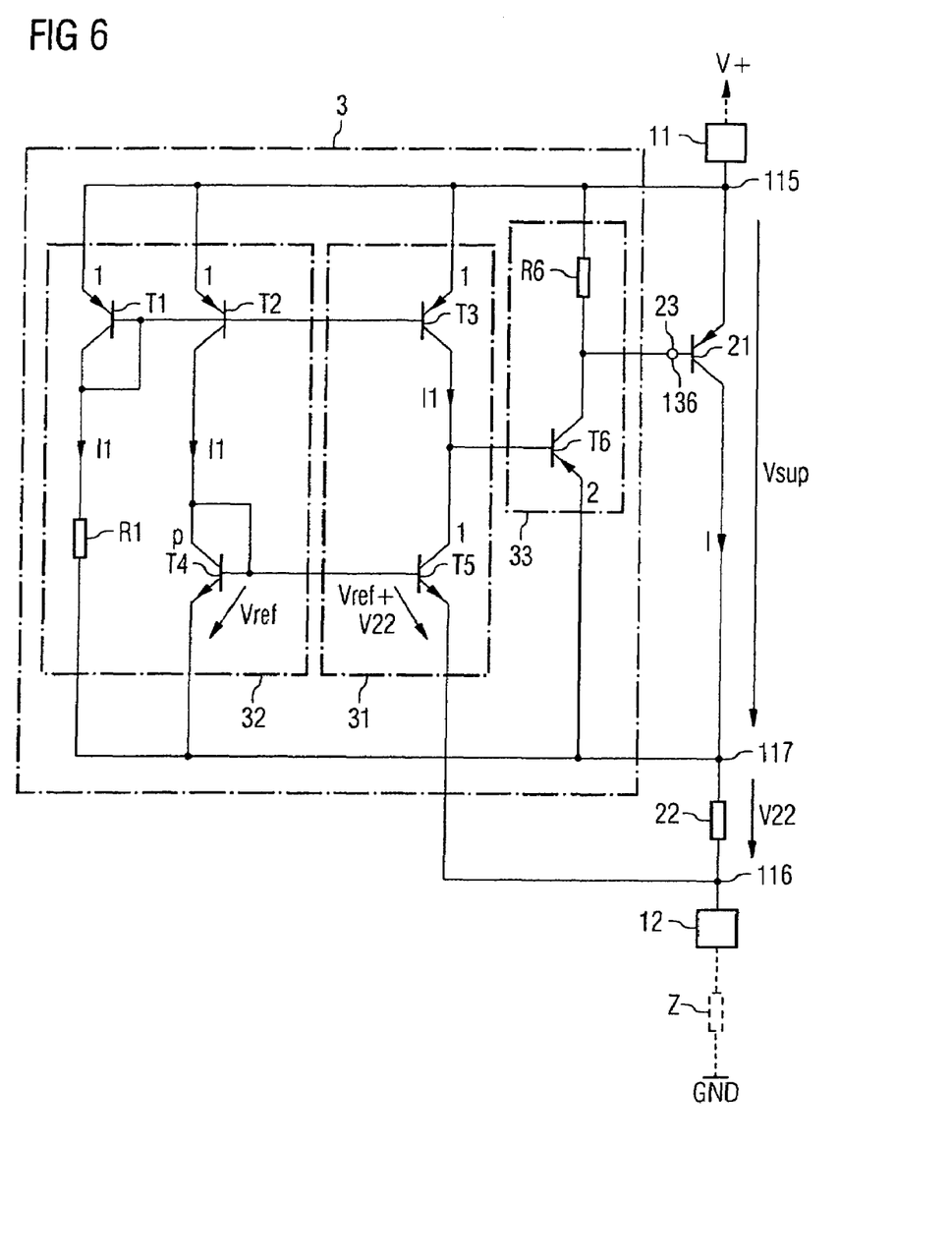
FIG. 6 shows an exemplary circuitry realization for the evaluation and drive circuit when using a bipolar transistor as transistor.

FIG. 6 shows an exemplary circuitry realization for the evaluation and drive circuit 3 of the current regulator according to the invention. The vertical transistor 21 is formed as a pnp bipolar transistor in the example. The load path, that is to say the emitter-collector path of this bipolar transistor 21, is connected in series with the current measuring resistor 22, which, referring to the previous explanations, is formed by a part of the load path of the vertical transistor 21, between the first and second terminal contacts 11, 12. In order to afford a better understanding, the circuit nodes which correspond to the respective terminal contacts on the semiconductor body 1 in accordance with FIGS. 2 and 3 and on the semiconductor bodies 1', 1" in accordance with FIGS. 4 and 5 are identified by corresponding reference symbols in FIG. 6.

Part of the load path voltage of the vertical transistor 21 serves as supply voltage for this evaluation and drive circuit 3. For this purpose, the evaluation and drive circuit 3 is connected to the first terminal contact 11, which, referring to FIG. 2, makes contact with a transistor zone, and is connected to the terminal contact 117, which represents a type of center tap between the load path of the vertical transistor 21 and the current measuring resistor 22. This arrangement ensures that, with the exception of a small portion—yet to be explained—of the supply current of the evaluation and drive circuit 3, the entire current flowing into the circuit via the first terminal contact 11 flows via the current measuring resistor 22. This results in high precision of the current regulation and enables the current regulator to be realized as a circuit having only two external connections.

A reference voltage source 32 comprises a first transistor T1, which is connected up as a diode and is connected in series with a first resistor R1 between the supply connections 115, 117 of the evaluation and drive circuit 3. In the example, the first transistor T1 is a pnp bipolar transistor and is part of a current mirror which furthermore comprises a second transistor T2 and a third transistor T3. The load path of the second transistor T2 is connected in series with a load path of a fourth transistor T4 between the supply connections 115, 117. The second transistor T2 is formed as a pnp bipolar transistor, the base of which is connected to the base of the first transistor T1. The fourth transistor T4 is formed as an npn bipolar transistor and connected up as a diode.

In the example, the third transistor T3 of the current mirror is formed as a pnp bipolar transistor, the base of which is connected to the base connections of the first and second current mirror transistors T1, T2. The load path of said third transistor T3 is connected in series with the load path of a fifth transistor T5, which is formed as an npn bipolar transistor in the example, between the supply connection 115 and the second terminal contact 116, 12 of the current regulator.

The third and fifth transistors T3, T5 are likewise part of the reference voltage source 32. A reference voltage Vref, with which the measurement voltage V22 present across the measuring resistor 22 is compared, in this case corresponds to the difference between the base-emitter voltages of the fourth and fifth transistors T4, T5. The following thus holds true:

$$V\text{ref}=V\text{be}5-V\text{be}4 \qquad (1),$$

where Vbe5 designates the base-emitter voltage of the fifth transistor T5 and Vbe4 designates the base-emitter voltage of the fourth transistor T4. In this case, the transistor area of the fourth transistor T4 is greater by a factor of p than the area of the fifth transistor T5, which, with these two transistors T4, T5 having identical collector currents, leads to different base-emitter voltages Vbe4, Vbe5.

Assuming that identical collector currents in each case flow through these two transistors T4, T5 by virtue of the current mirror transistors T2, T3, the following arises for the reference voltage in a known manner:

$$V\text{ref}=V\text{be}5-V\text{be}4=Vt\cdot\ln(p) \qquad (2).$$

The following holds true in this case for Vt:

$$Vt=k\cdot T/e \qquad (3),$$

where k designates Boltzmann's constant, T designates the absolute temperature and e designates the elementary charge.

The third and fifth transistors T3, T5 additionally form a comparator arrangement for comparing the reference voltage Vref with the measurement voltage V22. An output of this comparator arrangement 31 is formed by a node common to the load paths of the third and fifth transistors T3, T5. A driver circuit driven via the output of said comparator arrangement 31 comprises a series circuit formed by a nonreactive resistor R1 and a sixth transistor T6. The load path of said sixth transistor T6 is in this case connected in series with the nonreactive resistor R1 between the supply connections 115, 117. In the example, the sixth transistor T6 is formed as an npn bipolar transistor, the base of which is driven via the output of the comparator arrangement 31.

The functioning of this current regulator is explained below.

The fifth transistor T5 of the comparator arrangement 31 controls the base current of the sixth transistor T6 of the driver circuit 33. An approximately constant current is made available by the third transistor T3 which current, depending on a voltage V22 present across the current measuring resistor 22, is divided into a base current of the sixth transistor T6 and the collector current of the fifth transistor T5. Consideration shall now be given to an operating point of the fifth transistor T5 at which the base-emitter voltage of the fifth transistor T5 lies in the region of the threshold voltage or above the threshold voltage of said transistor T5. If the measurement voltage V22 rises on account of a rising current flowing through the measuring transistor 22, then the base-emitter voltage of said fifth transistor T5 increases, as a result of which the transistor T5 is turned on further. On account of this, that portion of the current supplied by the third transistor T3 which flows into the base of the sixth transistor T6 is reduced. The sixth transistor is thereby regulated downward, as a result of which the potential at the output of the driver circuit 33, said output being formed by the center tap between the nonreactive resistor R1 and the load path of the transistor T6, rises. The vertical transistor 21, which is formed as a pnp bipolar transistor in the example, is thereby regulated downward, as a result of which the load current is reduced.

If, in the other case, the measurement voltage V22 decreases on account of a decreasing current flowing through the vertical transistor 21, then the fifth transistor T5 is regulated downward. As a result, the base current of the sixth transistor T6 increases and the sixth transistor T6 is thereby turned on. The base potential of the vertical pnp transistor thus decreases, as a result of which the transistor 21 is turned on further in order to counteract a further decrease in the load current.

An at least approximately constant current flowing through the vertical transistor 21 is generated as a result of these regulating mechanisms explained.

The value to which the measurement voltage V22 at the measuring transistor 22 is adjusted corresponds approximately to the reference voltage Vref in the case of the drive and evaluation circuit 3 illustrated.

The measuring resistor may be dimensioned depending on the desired purpose for use such that it has a positive or negative temperature coefficient or is approximately independent of temperature. The temperature dependence can be set by way of the doping of the semiconductor zone which forms the measuring resistor.

If the measuring resistor 22 has a positive temperature coefficient, then the measurement voltage V22 rises with the load current being the same and the temperature rising, with the consequence that the load current I is reduced. A current regulating arrangement with a measuring resistor dimensioned in this way can fulfill a protection function for a load Z to be driven if it is mounted on the load Z in such a way that it is thermally coupled to the load. If the temperature of the load Z rises for example on account of an excessively high load current, then the regulating arrangement reduces the load current in order to counteract a further rise in temperature.

If the measuring resistor has a negative temperature coefficient, then the measurement voltage V22 decreases with the load current being the same and the temperature rising, with the consequence that the load current is increased. The use of such a current regulator is expedient for such loads which require an increased load current when the temperature rises. Examples of such loads are light emitting diodes. In the case of light emitting diodes, the light efficiency decreases as the temperature rises, so that as the temperature rises, an increased load current is required for an identical light efficiency.

Figure 7:
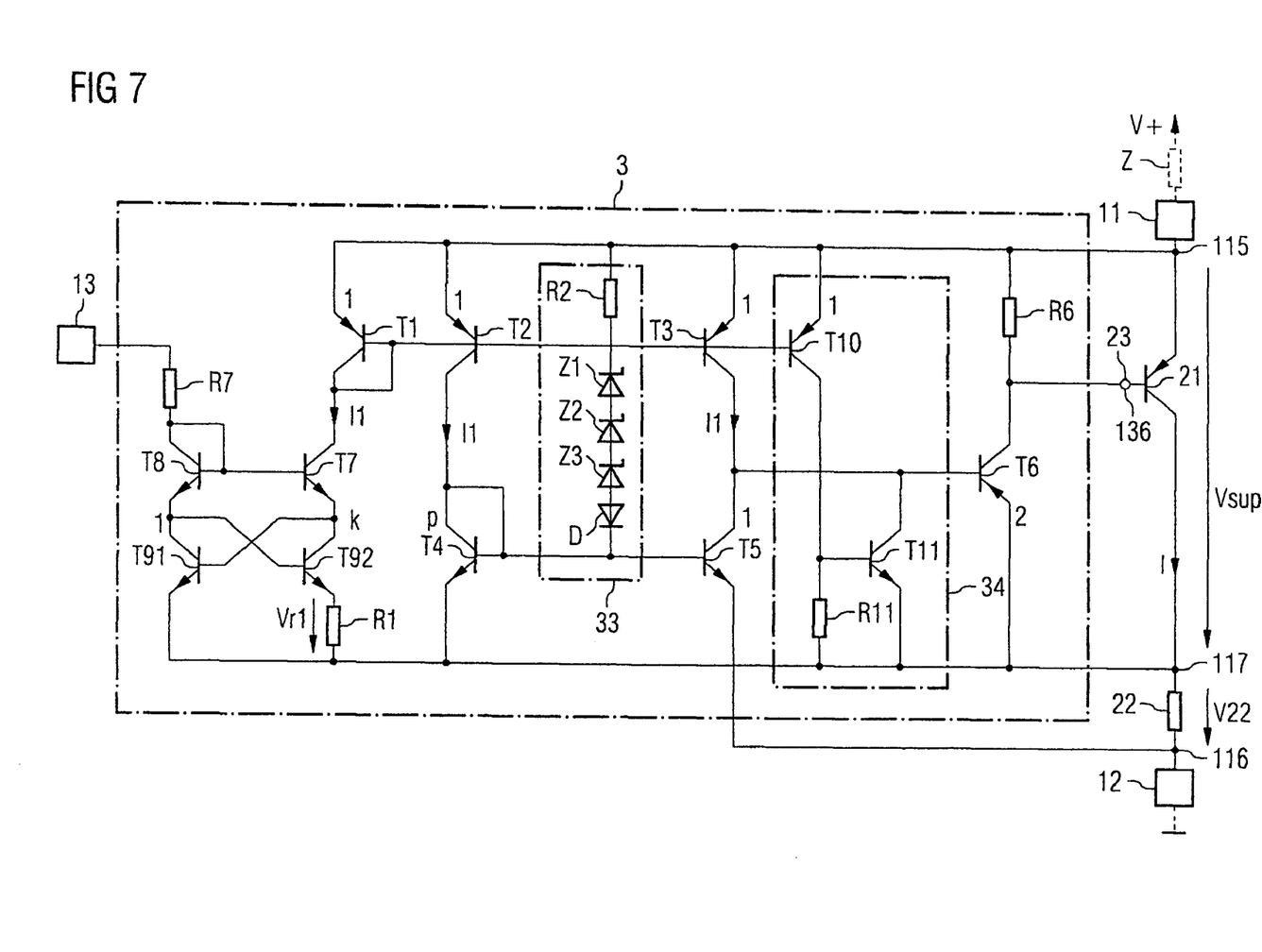
FIG. 7 shows a modification of the evaluation and drive circuit according to FIG. 6.

FIG. 7 shows a modification of the current regulator according to FIG. 6, which current regulator has an additional external connection 13 for switching the current regulator on and off. Said connection 13 drives a further transistor T7 via a series resistor R7, said further transistor being formed as an npn bipolar transistor in the example and its load path being connected in series with the first transistor T1 of the current mirror and the resistor R1.

The current regulator is switched off if the further transistor T7 is in the off state, and is switched on if said additional transistor T7 is in the on state. For the purpose of switching on and off, it is necessary that a potential suitable for on-state or off-state driving of said transistor be applied to the additional connection 13.

When the current regulator is used in a high-side configuration, that is to say when the regulator is connected between the terminal for the positive supply potential and the load, said transistor T7 can be turned off by the additional connection 13 being connected to the potential of the second connection terminal 12. In this case, said transistor T7 can be turned on by the additional connection 13 being connected to the potential of the first connection terminal 11.

When the current regulator is used in a low-side configuration as illustrated in FIG. 7, that is to say when the regulator is connected between the load Z and the negative supply potential GND, a potential that is greater than the sum of the threshold voltage of the transistor and the measurement voltage V22 has to be applied to the terminal 13 for on-state driving of the transistor T7. A correspondingly smaller potential is applied to the terminal 13 for turn-off. The drive signal at the terminal 13 is generated by a microcontroller, by way of example.

The regulator in accordance with FIG. 7 optionally has a drive circuit connected to the further transistor T7 and having two cross-coupled npn transistors T91, T92, one T91 of which is connected in series with the further transistor T7 and the other T92 of which is connected in series with the series resistor R7. A transistor T8 connected up as a diode is connected between the series resistor R7 and the resistor T92.

The transistors T91, T92 form a regulating circuit in which the current through the transistor T92 is regulated in such a way that a voltage Vr1 is dropped across the resistor R1 connected in series with said transistor T92, for which voltage the following holds true:

$$Vr1 = Vt \cdot \ln(k) \tag{4}.$$

In this case, the relationship specified in equation (3) holds true for Vt, k designates the area ratio of the emitter area of the transistor T92 to the emitter area of the transistor T91. The transistor T7 forms a current sink which can be switched on and off by the signal at the input 13. The transistor T8 connected up as a diode serves merely for potential shifting.

The evaluation and drive circuit 3 in accordance with FIG. 7 additionally has an overvoltage protection circuit 33 and an overtemperature protection circuit 34.

The overvoltage protection circuit 33 has a series circuit comprising a resistor R2, at least one zener diode Z1-Z4 (three in the example) and a diode D, which is connected between the first connection 11 and the base connections of the fourth and fifth transistors. If the voltage at the first connection 11 exceeds a voltage limit that is essentially predetermined by the sum of the breakdown voltages of the zener diodes Z1-Z3, the fifth transistor is turned on, as a result of which the sixth transistor T6 carries less current and the sixth transistor T6 regulates the transistor 21 downward in order to reduce the collector current thereof and to regulate the output current of the regulator downward to a suitable value.

The overtemperature protection circuit has a further current mirror transistor T10, the load path of which is connected in series with a temperature-dependent resistor R11 between the connections 11, 117. The resistor has a positive temperature coefficient and drives a further transistor connected between the base and emitter of the sixth transistor T6. Essentially a constant current flows through the resistor by virtue of the current mirror transistor T10. If the temperature rises, then the voltage drop across the resistor R11 increases (as does the voltage drop across the resistor R1 as well). If said voltage drop across the resistor R11 reaches the value of the threshold voltage of the transistor T11, said transistor T11 switches on and thereby turns off the sixth transistor T6, with the consequence that the transistor 21 is likewise turned off and the regulator is switched off.

The current regulator according to the invention is not restricted to the use of a vertical bipolar transistor.

Figure 8:
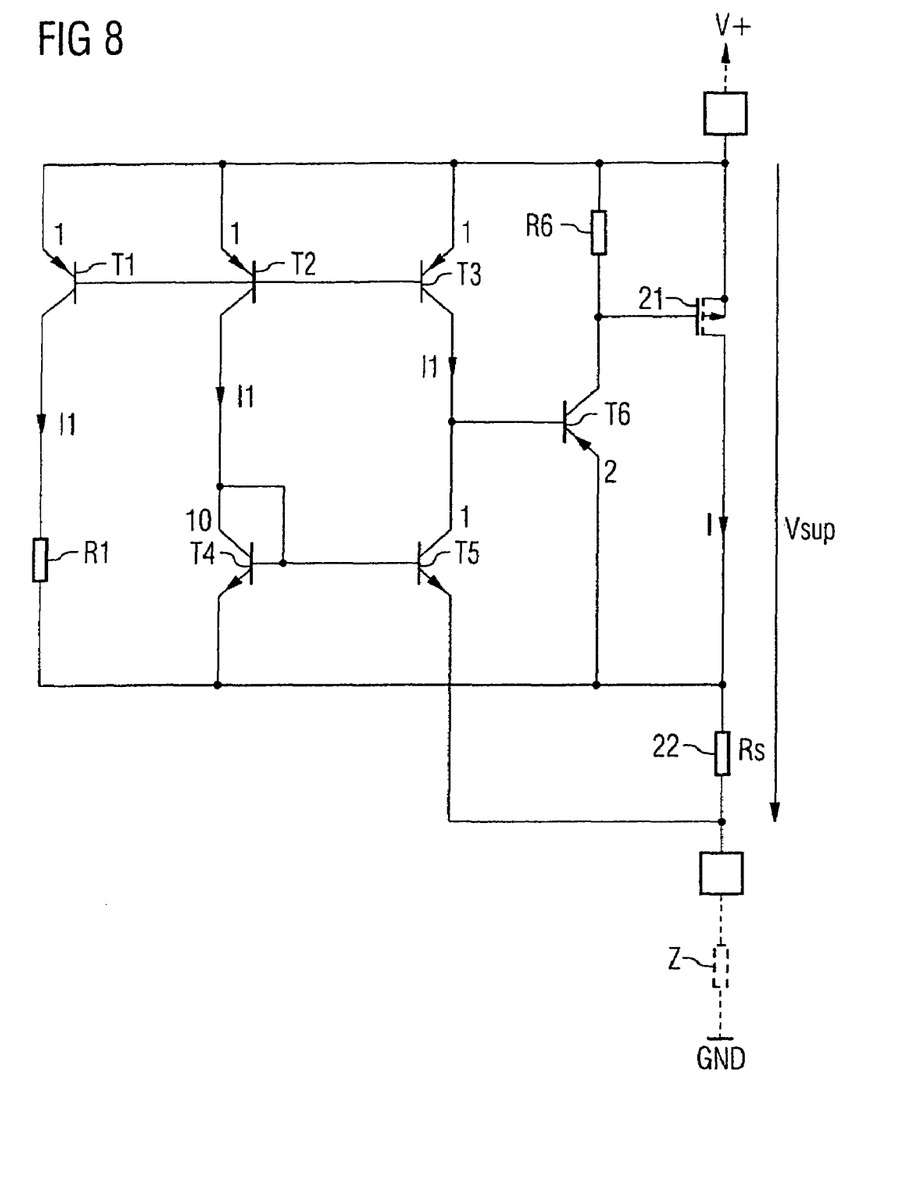
FIG. 8 shows an exemplary circuitry realization for the evaluation and drive circuit when using a MOS transistor as transistor.

Referring to the circuit arrangement in FIG. 8, a vertical MOS transistor, for example a vertical p-channel MOS transistor, may also be used as the vertical transistor. In this case, the drive circuit may correspond to the drive circuit for driving a vertical bipolar transistor.

Figure 9:
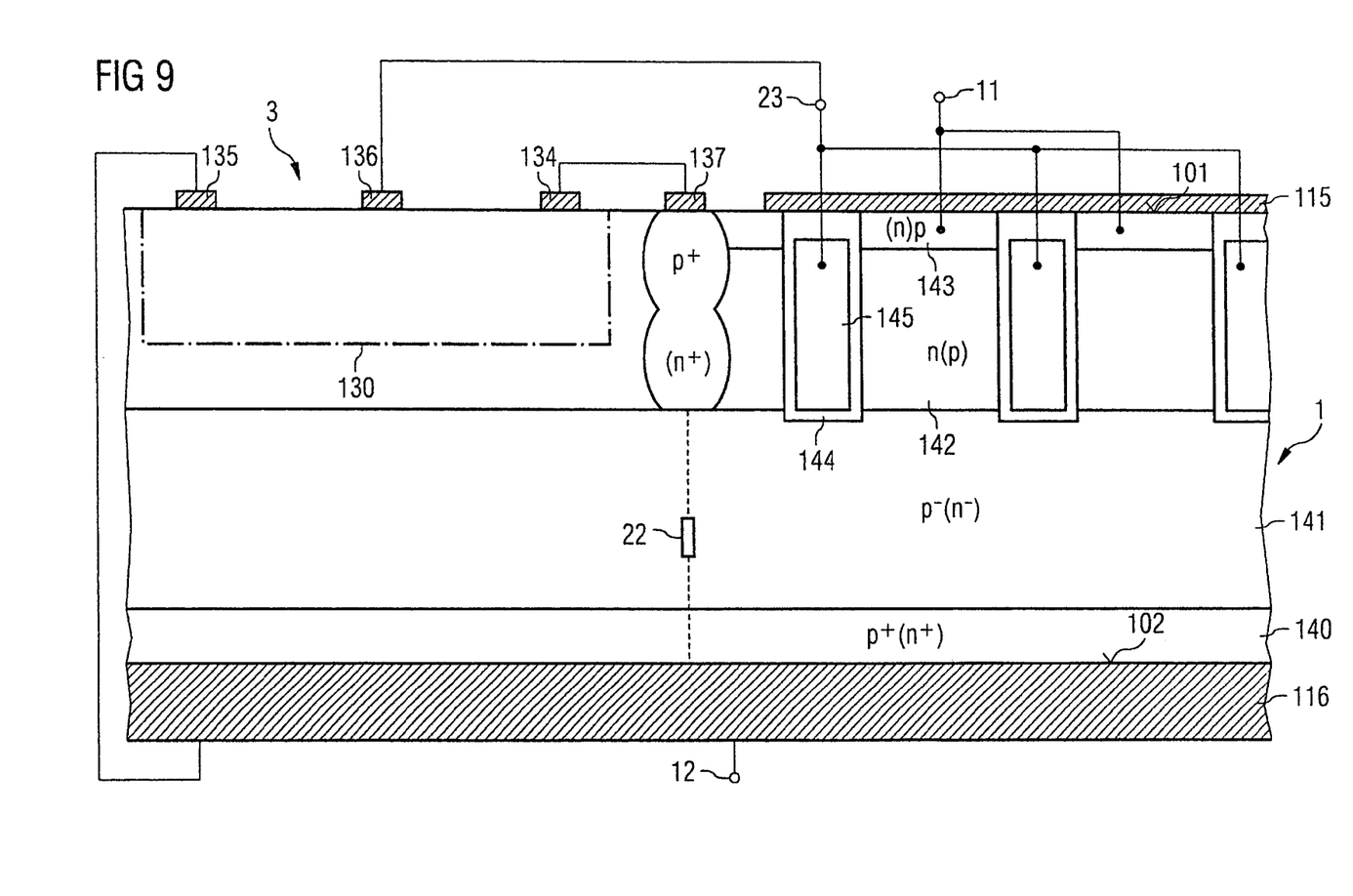
FIG. 9 schematically shows in side view in cross section a semiconductor body with a vertical transistor formed as a MOS transistor, a current measuring resistor and an evaluation and drive circuit.

FIG. 9 shows in side view in cross section a semiconductor body 1, into which a vertical MOS transistor is integrated alongside the evaluation and drive circuit 3. In the example, the transistor is realized as a trench transistor constructed in a cellular manner. The transistor has, lying one above another in a vertical direction of the semiconductor body 1, a drain zone 140, a drift zone 141 of the same conduction type as the drain zone 140 and doped more weakly than the drain zone 140, a body zone 142 doped complementarily with respect to the drain and drift zones 140, 141, and also a source zone 143 doped complementarily with respect to the body zone 142. In the case of this component, gate electrodes 145 are arranged in trenches that extend in the vertical direction of the semiconductor body proceeding from a front side 101. The gate electrodes lie adjacent to the body zones 142 and are insulated from the semiconductor body by gate insulation layers 144. A connection electrode 115 applied to the front side 101 makes contact with the source zone 143 and forms the first terminal contact of the current regulator. The gate electrodes are contact-connected via the front side 101 of the semiconductor body in a plane that is offset with respect to the sectional plane illustrated in FIG. 8. Therefore, the connection of the gate electrodes 145 to the control terminal 23 is only illustrated schematically in FIG. 8.

In a manner that has already been explained, an electrically conductive layer 116, for example a metallization, is applied to the rear side 102 of the semiconductor body and forms the second terminal contact 12 of the current regulator.

In the case of this component, the current measuring resistor 22 is formed by the more weakly doped drift zone 141 and the drain zone 140. The contact-connection of this current measuring resistor by means of a terminal contact 137 arranged in the region of the front side 101 is effected in accordance with the exemplary embodiment in FIG. 2 via a highly doped connection zone 114 extending in the vertical direction into the semiconductor body 1 as far as the drift zone 141.

In order to realize such a component, by way of example, a highly doped semiconductor substrate is made available, which later forms the drain zone. A semiconductor layer forming the drift zone 141 and a semiconductor layer forming the body zone 142 are applied successively to said semiconductor substrate, for example by means of an epitaxy method. Afterward, for example by means of a diffusion or implantation method, the source zones 143 are produced before or after the gate electrodes 145 are produced in the trenches.

Besides a bipolar transistor and a MOS transistor, an IGBT may also be used as the vertical transistor of the current regulator. The basic construction of such an IGBT differs from the construction of the MOS transistor illustrated in FIG. 8 mainly by virtue of the fact that the highly doped semiconductor zone 140 arranged in the region of the rear side is doped complementarily with respect to the adjoining more weakly doped semiconductor zone 141. In the case of a MOSFET, this highly doped semiconductor zone forms its collector zone, while the more weakly doped semiconductor zone forms one of the base zones of the IGBT.

When such an IGBT is used, the current measuring transistor 22 is formed by the collector zone and one of the base zones of the IGBT.

In the case of the above-explained exemplary embodiment of the current regulator according to the invention, the transistors are in each case formed as vertical transistors. However, lateral transistors are also suitable as transistors for use in connection with the current regulator according to the invention.

LIST OF REFERENCE SYMBOLS

D Diode
GND Reference potential
R1, R6, R7 Resistors
T1, T2, T4 pnp bipolar transistors
T3, T5, T6 npn bipolar transistors
T7 npn bipolar transistor
T8, T91, T92 npn bipolar transistors
V+ Supply potential
V22 Measurement voltage
Vref Reference voltage
z Load
Z1-Z3 Zener diodes
1 Semiconductor body
2 Vertical transistor
3 Evaluation and drive circuit
11 First terminal contact of the current regulator.
12 Second terminal contact of the current regulator
13 Third terminal contact of the current regulator
21 Vertical transistor
22 Current measuring resistor integrated in the vertical transistor
23 Drive connection of the vertical transistor
31 Comparator circuit
32 Reference voltage source
33 Driver circuit
101 Front side of the semiconductor body
102 Rear side of the semiconductor body
110 Collector zone
111 Base zone
112 Emitter zone
113 Base connection zone
114 Highly doped connection zone
115 Connection electrode
116 Connection electrode, leadframe
117 Terminal contact
122 Base terminal contact
124 Semiconductor substrate
130 Region of the evaluation and drive circuit in the semiconductor body
131-133 Transistor zones of a lateral bipolar transistor 134 Terminal contact
135 Terminal contact
137 Bonding wire
138 Terminal contact
140 Drain zone
141 Drift zone
142 Body zone
143 Source zone
144 Insulation layer
145 Gate electrode
1', 102' Semiconductor body
118, 119 Connection legs
121, 136 Bonding wires

The invention claimed is:

1. A current regulator comprising:
    a first semiconductor body having a first and second terminal contact,
    a transistor having a control terminal and a load path integrated in the first semiconductor body, the load path operably connecting the first and second terminal contacts of the semiconductor body,
    a current measuring resistor, which is at least partly formed by a section of the load path of the transistor,
    a drive circuit to the current measuring resistor, the drive circuit configured to drive the transistor depending on a voltage across the measuring resistor.

2. The current regulator according to claim 1, wherein the transistor has at least a first, a second and a third transistor zone arranged alongside one another in a first direction of the semiconductor body, wherein the first transistor zone is connected to the first terminal contact and the third transistor zone is connected to the second terminal contact, and wherein the current measuring resistor is at least partly formed by the third transistor zone.

3. The current regulator according to claim 2, wherein the transistor includes a vertical transistor, the first, second and third transistor zones being arranged alongside one another in a vertical direction of the semiconductor body.

4. The current regulator according to claim 2, wherein the transistor includes a lateral transistor, the first, second and third transistor zones being arranged alongside one another in a lateral direction of the semiconductor body.

5. The current regulator according to claim 1, wherein the current measuring resistor has two terminal contacts, a first terminal contact of the current measuring resistor being the second terminal contact of the current regulator.

6. The current regulator according to claim 2, wherein the current measuring resistor has a terminal zone arranged in the first semiconductor body, the terminal zone arranged between the third transistor zone a first terminal contact of the current measuring resistor.

7. The current regulator according to claim 1, wherein the first and second terminal contacts of the current regulator are disposed on opposite sides of the first semiconductor body.

8. The current regulator according to claim 3, wherein the vertical transistor comprises a bipolar transistor, the second transistor zone forming the base zone.

9. The current regulator according to claim 3, wherein the vertical transistor comprises a field effect transistor, the second transistor zone forming a body zone, the vertical transistor including a gate electrode insulated from the body zone.

10. The current regulator according to claim 1, wherein the second terminal contact includes an electrically conductive carrier on which the first semiconductor body is disposed.

11. The current regulator according to claim 1, wherein the drive circuit is integrated in the first semiconductor body.

12. The current regulator according to claim 1, wherein the drive circuit is integrated in a second semiconductor body.

13. The current regulator according to claim 12, wherein the second semiconductor body is applied to the first semiconductor body.

14. The current regulator according to claim 12, wherein the second semiconductor body is arranged adjacent the first semiconductor body.

15. The current regulator according to claim 1, wherein the drive circuit is configured to compare a voltage present at the current measuring resistor with a reference voltage and to drive the transistor depending on a result of the comparison.

16. The current regulator according to claim 1, wherein the drive circuit includes a reference voltage source and a differential amplifier configured to drive the transistor.

17. The current regulator according to claim 16, wherein a driver element is connected between the differential amplifier and the control terminal of the vertical transistor.

18. A current regulator comprising:
    a first semiconductor body having a first and second terminal contact,
    a transistor having a control terminal and a load path integrated in the first semiconductor body, the load path operably connecting the first and second terminal contacts of the semiconductor body,
    means for measuring a current, said means at least partly formed by a section of the load path of the transistor,
    means for driving the transistor depending on the measured current.

19. A current regulator comprising:
    a first semiconductor body having a first and second terminal contact,
    a transistor having a control terminal and a load path integrated in the first semiconductor body, the load path operably connecting the first and second terminal contacts of the semiconductor body,
    a current measuring element at least partly formed by a section of the load path of the transistor and integrated in the first semiconductor body,
    a drive circuit to the current measuring resistor, the drive circuit configured to drive the transistor depending on a voltage across the measuring resistor.

20. The current regulator according to claim 19, wherein the transistor has at least a first, a second and a third transistor zone arranged alongside one another in a vertical direction of the semiconductor body, wherein the first transistor zone is connected to the first terminal contact and the third transistor zone is connected to the second terminal contact, and wherein the current measuring element is at least partly formed by the third transistor zone.

* * * * *